United States Patent

Chien et al.

[11] Patent Number: 5,946,248
[45] Date of Patent: Aug. 31, 1999

[54] METHOD FOR BURN-IN OPERATION ON A WAFER OF MEMORY DEVICES

[75] Inventors: Pien Chien, Taipei; Shih-Chin Lin, Kaohsiung Hsien; Charlie Han, Hsinchu Hsien, all of Taiwan

[73] Assignee: United Microelectronics, Corp., Taipei, Taiwan

[21] Appl. No.: 09/032,401

[22] Filed: Feb. 27, 1998

[30] Foreign Application Priority Data

Nov. 22, 1997 [TW] Taiwan ................................. 86117513

[51] Int. Cl.$^6$ ..................................................... G11C 13/00
[52] U.S. Cl. ................................ 365/201; 365/63; 365/96
[58] Field of Search ........................ 365/96, 201, 189.01, 365/51, 63

[56] References Cited

U.S. PATENT DOCUMENTS 5,373,478  12/1994  Komatsu ..................................... 365/63

Primary Examiner—Terrell W. Fears
Attorney, Agent, or Firm—Thomas, Kayden, Horstemeyer & Risley, L.L.P.

[57] ABSTRACT

A method is provided for use on a wafer formed with a plurality of dice on each of which a memory device, such as a DRAM (dynamic random access memory) device to perform a burn-in operation on the memory device so as to test the reliability thereof. By this method, a plurality of pads are formed in the scribe lines that are used as reference marks in the cutting apart of the dice. These pads are used to transfer an externally generated burn-in enable signal and a DC bias voltage to each memory device. Since the pads for burn-in wiring are formed in the scribe lines, they will not take additional space on the dice where each memory device is formed. The burn-in operation is more convenient, quick, and cost-effective to implement.

5 Claims, 3 Drawing Sheets

METHOD FOR BURN-IN OPERATION ON A WAFER OF MEMORY DEVICES

CROSS-REFERENCE TO RELATED APPLICATION

This application claims the priority benefit of Taiwan application serial no. 86117513, filed Nov. 22, 1997, the full disclosure of which is incorporated herein by reference.

BACKGROUND OF THE INVENTION

1. Field of the Invention

This invention relates to semiconductor technologies, and more particularly, to a method for use on a wafer formed with multiple discrete semiconductor devices, such as DRAM (dynamic random access memory) devices, to perform a burn-in operation on the semiconductor devices so as to test the reliability thereof.

2. Description of Related Art

Burn-in is the operation of a new integrated circuit (IC) product for a specified time under accelerated aging conditions prior to the shipment so as to sort out premature failures. The burn-in operation is an essential step for testing the reliability of the IC products. Most IC products, such as DRAMs, undergo the burn-in operation after they have been cut apart from the wafer and then packaged in holders. One drawback to this practice is that, in the event that any failures are found in the addresses, including row or column addresses, or memory cells in the DRAM package during the burn-in operation, the IC chip is not repairable since it is already sealed in the package. As a consequence, the whole IC package may have to be discarded or sold at a significantly reduced price.

A solution to the forgoing problem has been disclosed and published in IEEE, IEDM 93-639 by Tohru Furuyama et al. of Toshiba Corporation of Japan. This paper teaches an improved method for the burn-in operation on the DRAM devices formed on a wafer. This method, however, still has the following drawbacks. First, for each DRAM device, the burn-in for the memory cells thereof and the burn-in for the periphery circuitry thereof should be separately performed (i.e., a concurrent burn-in operation to these two parts of each DRAM device is impossible). The overall burn-in is therefore quite time-consuming. Second, since the burn-in is carried out by using a number of probes to poke on the pads formed on each die in the wafer, additional work time may be required if the number of probes is insufficient. Third, it requires the provision of a number of test pads on each die in the wafer for the burn-in operation, which causes each die to be take additional real estate of the wafer in order to incorporate these test pads thereon. The die is therefore large in size.

SUMMARY OF THE INVENTION

It is therefore an objective of the present invention to provide a method for burn-in operation on a wafer of DRAM devices, which allows the memory cells and the periphery circuitry of each DRAM device to undergo the burn-in operation at the same time so as to reduce the overall burn-in time.

It is another objective of the present invention to provide a method for burn-in operation on a wafer of DRAM devices, which allows each die of DRAM device to be small in size due to the elimination of test pads that are conventionally provided on the die surface to facilitate the burn-in operation.

It is still another objective of the present invention to provide a method for burn-in operation on a wafer of DRAM devices, which allows each DRAM device to be repairable when failures are found during the burn-in operation.

In accordance with the foregoing and other objectives of the present invention, a new method for burn-in operation on a wafer of DRAM devices is provided.

The method of the invention for burn-in operation includes the following steps of:

(1) forming at least a first pad and a second pad in one of said scribe lines;

(2) connecting the first pad to the test circuit in each die;

(3) connecting the second pad to the bias input end of each die;

(4) generating and transferring an externally generated DC bias voltage via the second pad to the bias input end of each of the dice;

(5) generating and transferring an externally generated burn-in enable signal via the first pad to the test circuit in each of the dice, said burn-in enable signal causing said test circuit to generate a burn-in oscillating signal;

(6) converting the burn-in oscillating signal into a plurality of pulse trains which are used for burn-in operation on the periphery circuitry of the memory device other than the memory cells; and (7) transferring the burn-in enable signal to a column sense amplifier and a row decoder, which enables the column sense amplifier and disables the row decoder, and further enables all the word lines and all the row addresses and disables all the column addresses, so as to perform burn-in on the memory cells of the memory device.

In the foregoing circuit, the test circuit is used to performs a burn-in operation on the associated memory device in response to the burn-in enable signal. Its constituent elements include oscillator means for generating a burn-in oscillating signal in response to the burn-in enable signal; and a series of cascaded toggle circuits for generating a plurality of pulse trains used for burn-in operation on the periphery circuitry of the DRAM device other than its memory cells.

The invention allows the total time of the burn-in operation to be significantly reduced due to the concurrent burn-in operation on both the memory cells and the periphery circuitry of the DRAM device. Also, the invention allows the IC chip of the DRAM device to be repairable in the event that failures are found during the burn-in operation, allowing the manufacture of the DRAM to be more cost-effective. Furthermore, the invention allows the IC chip to be considerably reduced in size due to the elimination of test pads on the IC chip in the prior art which are instead formed in the scribe lines 14 between the various IC chips on the wafer.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
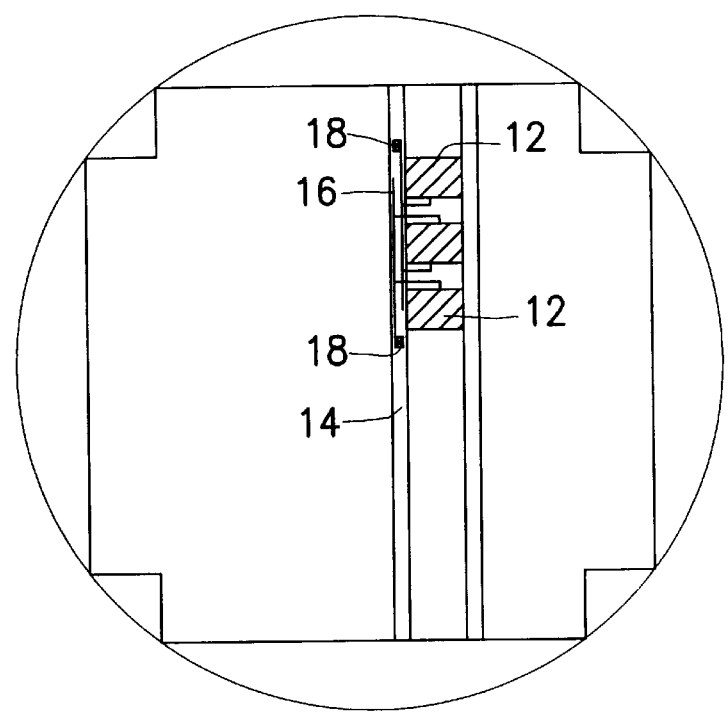
FIG. 1 is a schematic diagram of a wafer of DRAM devices on which the method of the invention is utilized to perform a burn-in operation.

FIG. 1 is a schematic diagram of a wafer of DRAM devices on which the method of the invention is utilized to perform a burn-in operation. As shown, the wafer is formed with a plurality of dice 12 on each of which a DRAM device is formed. Further, a plurality of scribe lines 14 are formed between the dice 12, which are to be used as reference marks to cut the dice 12 apart. In accordance with the invention, a plurality of pads 18 and routing wires 16 are formed in these scribe lines 14. Since the scribe lines 14 are typical provisions on a wafer, these pads 18 and routing wires 16 will not take extra real estate on the dice 12 where the DRAM devices are formed.

Figure 2:
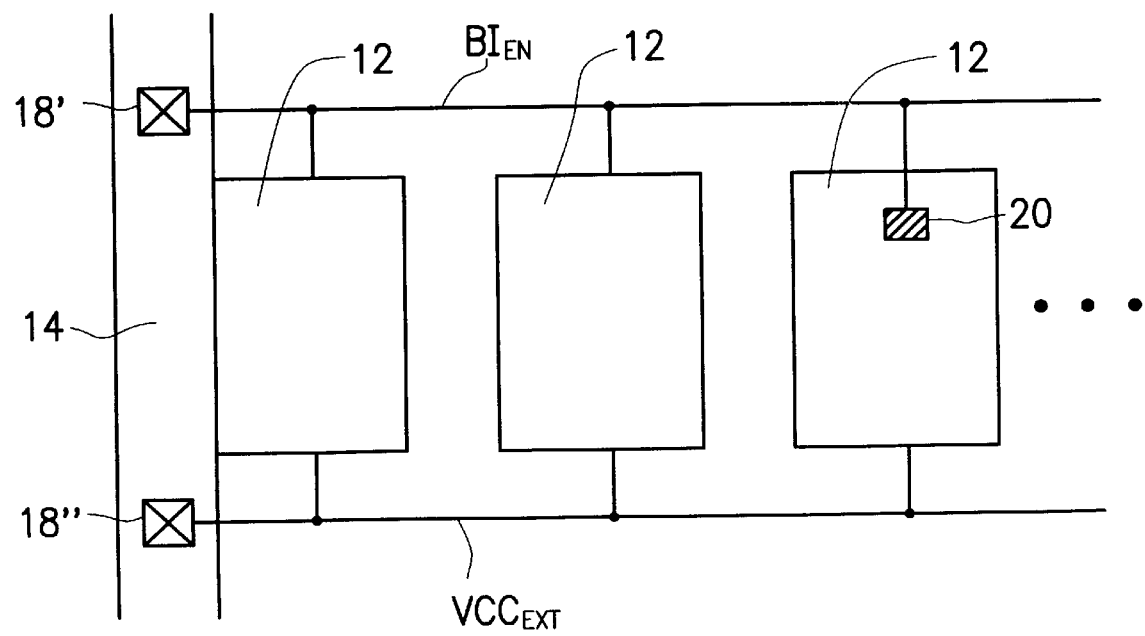
FIG. 2 is schematic diagram showing an enlarged part of the wafer of FIG. 1.

FIG. 2 is schematic diagram showing an enlarged part of the wafer of FIG. 1. As shown, all the dice 12 in the wafer are set into groups, each group being associated with a first pad 18' and a second pad 18" formed in one scribe line 14. The first pad 18' is used to connect an externally generated burn-in enable signal $BI_{EN}$ to each of the dice 12 in this group, while the second pad 18" is used to connect an externally generated DC bias voltage $VCC_{EXT}$ to each of the dice 12 in this group. Further, each of the dice 12 is formed with a built-in test circuit 20 which is wired to the first pad 18' to receive the burn-in enable signal $BI_{EN}$.

Prior to the burn-in operation, the dice 12 are checked to see if they are suited for burn-in and if they are properly connected to the DC bias voltage $VCC_{EXT}$. If any die is found to be unsuited for burn-in, a fuse (not shown) can be used to isolate that die from other dice in the group so that the burn-in signals will not be applied thereto.

To perform a burn-in operation on the dice 12 in each group, the burn-in enable signal $BI_{EN}$ is set at a high-voltage logic state and then transferred via the first pad 18' to the test circuit 20 in each of the dice 12, and meanwhile the DC bias voltage $VCC_{EXT}$ is generated and transferred via the second pad 18" each of the dice 12. In response to the burn-in enable signal $BI_{EN}$, the built-in test circuit 20 in each of the dice 12 (only one is shown in FIG. 2) will perform burn-in operation on the periphery circuitry and the memory cells of the DRAM device at the same time. Details of the inside structure and function of the test circuit 20 are disclosed in the following.

Figure 3:
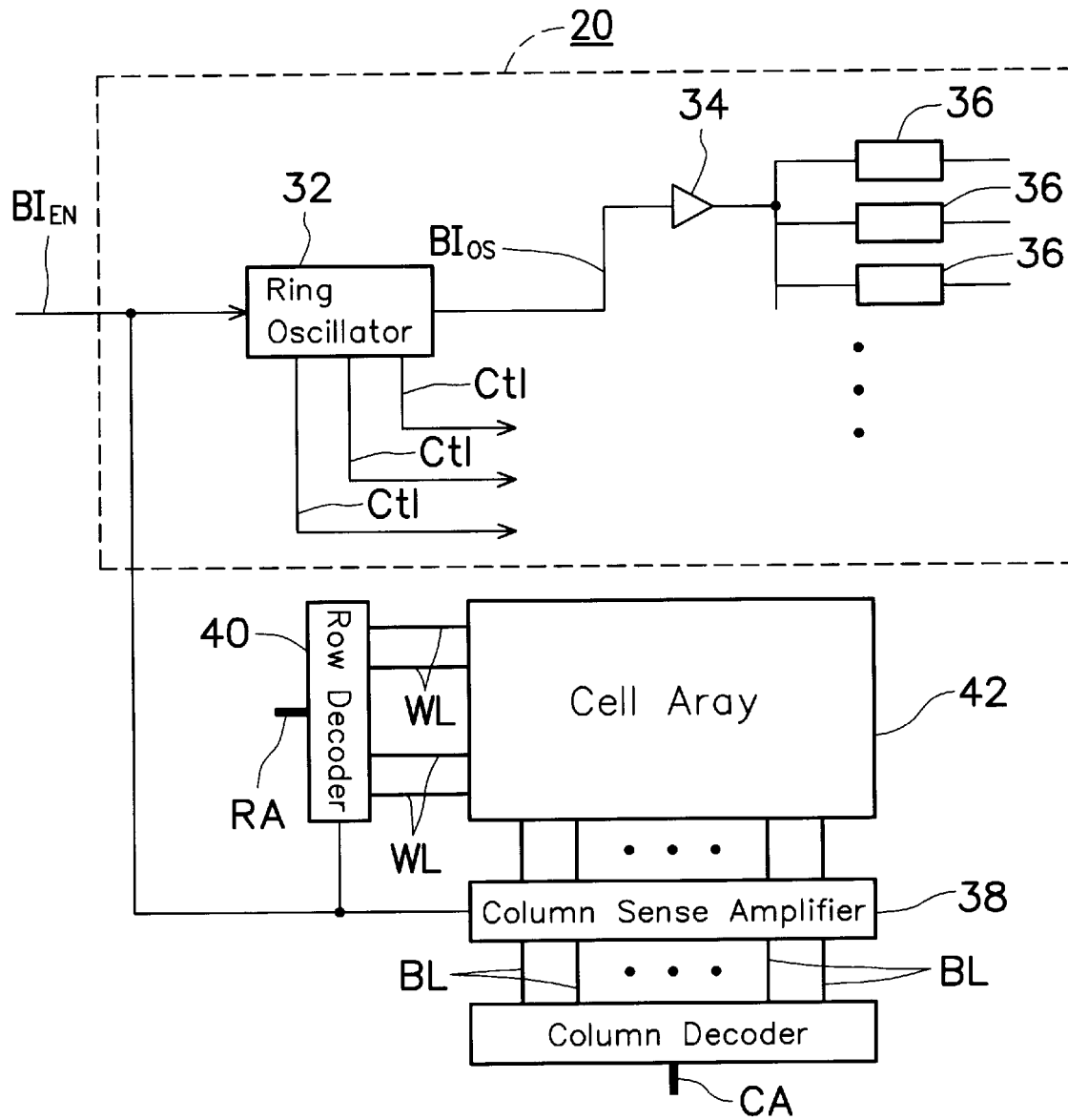
FIG. 3 is a schematic diagram showing detailed inside structure of a test circuit incorporated in each of the dice formed in the wafer of FIG. 1.
Figure 4:
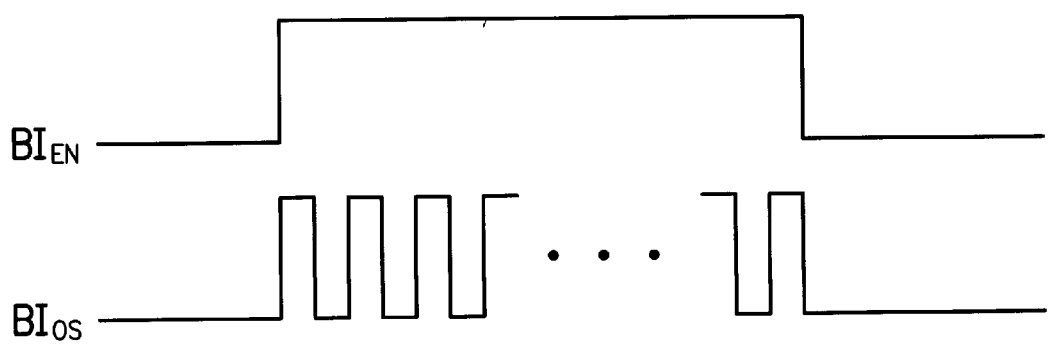
FIG 4 is a waveform diagram showing the timing relationship between a burn-in enable signal $BI_{EN}$ and a burn-in oscillating signal $BI_{OS}$ that are used for burn-in operation on each die in the wafer of FIG. 1.

FIG. 3 shows detailed inside structure of the test circuit 20. As shown, the test circuit 20 includes a ring oscillator 32, a buffer 34, and a plurality of address buffers 36. The burn-in enable signal $BI_{EN}$ triggers the ring oscillator 32 to generate a periodic pulse train (hereinafter referred to as burn-in oscillating signal and denoted by $BI_{OS}$) at a high frequency, which is then transferred via the buffer 34 to each of the address buffers 36. FIG. 4 shows the timing relationship between the burn-in enable signal $BI_{EN}$ and the burn-in oscillating signal $BI_{OS}$. As shown, during the time the burn-in enable signal $BI_{EN}$ is at a high-voltage logic state, the ring oscillator 32 will keep generating the periodic pulse train which serves as the burn-in oscillating signal $BI_{OS}$.

The burn-in oscillating signal $BI_{OS}$ from the ring oscillator 32 is used for burn-in operation on each address (or decoder) in the periphery circuitry of the DRAM device in each die. As shown in FIG. 3, the burn-in oscillating signal $BI_{OS}$ is transferred via the buffer 34 to each of the address buffers 36, and then used to perform a burn-in operation on each of the addresses associated with these address buffers 36. For example, these address buffers 36 output a plurality of column addresses CA. Further, the ring oscillator 32 can output a plurality of control signals Ctl for control of the row and column addresses of the DRAM device on each die.

Figure 5:
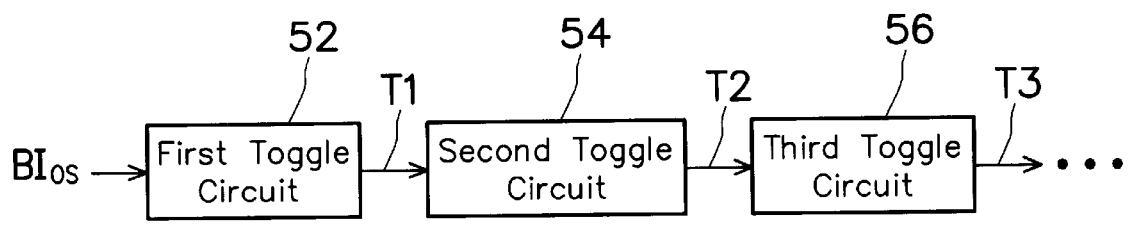
FIG. 5 is a schematic diagram of a series of cascaded toggle circuits devices used in the burn-in circuit of the invention to generate a plurality of pulse trains used for burn-in operation.

FIG. 5 is a schematic diagram of a series of cascaded toggle circuits used in the test circuit 20 to generate a plurality of pulse trains that are used for burn-in operation on the periphery circuitry of the DRAM device other than its memory cells on each die. The number of toggle circuits is dependent on the bit number of the DRAM device. As shown, the cascaded circuit includes a first toggle circuit 52, a second toggle circuit 54, and a third toggle circuit 56. The burn-in oscillating signal $BI_{OS}$ is input to the first toggle circuit 52.

Figure 6:
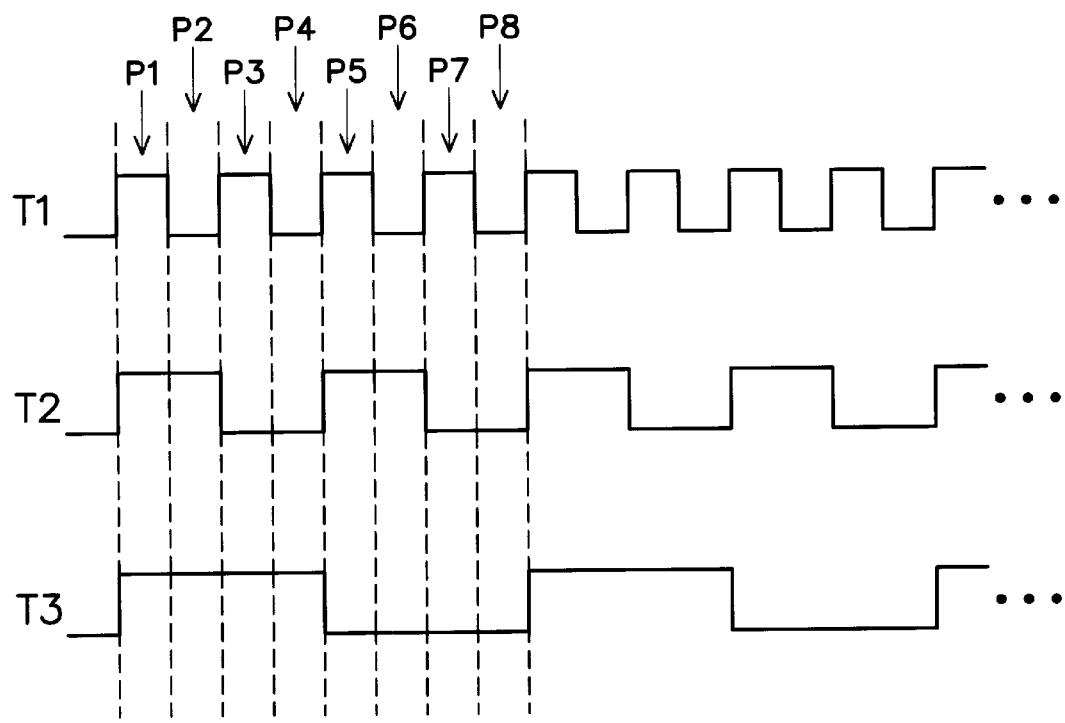
FIG. 6 is a waveform diagram showing the timing between the pulse trains generated by the toggle circuits shown in FIG. 5.

Referring also to FIG. 6, in response to the burn-in oscillating signal $BI_{OS}$, the first toggle circuit 52 generates a first trigger signal T1 which is also a periodic pulse train. The first trigger signal T1 is then transferred to the second toggle circuit 54. In response to T1, the second toggle circuit 54 generates a second trigger signal T2 which is also a periodic pulse train having a period which is two times that of T1. The second trigger signal T2 is then transferred to the third toggle circuit 56. In response to T2, the third toggle circuit 56 generates a third trigger signal T3 which is also a periodic pulse train having a period which is two times that of T2.

Taking a 3-bit DRAM device as example (which is used to explain the principle of the invention only; typical DRAMs are 8-bit or 16-bit), since there are a total of 8 addresses, the burn-in operation can be performed on the first address [111] during the first period P1 in T1; on the second address [011] during the second period P2 in T1; on the third address [101] during the third period P3 in T1; on the fourth address [001] during the fourth period P4 in T1; on the fifth address [110] during the fifth period P5 in T1; on the sixth address [010] during the sixth period P6 in T1; on the seventh address [100] during the seventh period P7 in T1; and on the eighth address [000] during the eighth period P8 in T1. In this manner, all the addresses in the DRAM device can be tested.

Referring back to FIG. 3, the burn-in enable signal $BI_{EN}$ is also transferred to a column sense amplifier 38 and a row decoder 40 which are constituent elements of the DRAM device. In response to the burn-in enable signal $BI_{EN}$, the column sense amplifier 38 is enabled, while the row decoder 40 is disabled. Moreover, all the word lines WL are enabled, and all the column addresses CA are disabled and all the row addresses RA are enabled (being put into a high-voltage logic state). To perform burn-in operation on the memory cells in cell array 42, the burn-in enable signal $BI_{EN}$ is raised to a high-voltage state (logic value 1), and the internal bias voltage of the memory cells is bypassed and then raised to the level of the externally applied DC bias voltage $VCC_{EXT}$, allowing the DC bias voltage $VCC_{EXT}$ to be also used to bias the word lines.

By conventional burn-in method, each word line is enabled during each period, and the time needed to complete the burn-in operation to each word line is about 1 μs (microsecond). In practice, however, the duration of the enabling of each row address selection (RAS) is only about 70%; and as a result, the active period of each word line is only about 0.7 μs. Therefore, if the conventional burn-in method is used on a 1M×16 DRAM, the total time needed to complete the burn-in operation is about 48 hours. The invention allows all the word lines to be enabled together at the same time. For a DRAM having a total of 1,024 word lines, it requires a duration of only about (48×60/1024)× 0.7=2 min to complete the burn-in operation. Moreover, by the prior art, the burn-in operation is performed after each die is cut apart from the wafer and sealed in IC packages; therefore, when failures are found during the burn-in operation, the whole IC package would be discarded. By the invention, however, the internal circuit of the IC chip can be repaired when failures are found during the burn-in operation.

In conclusion, the invention is more advantageous than the prior art in three aspects. First, the invention allows the total time of the burn-in operation to be significantly reduced due to the concurrent burn-in operation on both the memory cells and the periphery circuitry of the DRAM device. Second, the invention allows the IC chip of the DRAM device to be repairable in the event that failures are found during the burn-in operation, allowing the manufacture of the DRAM to be more cost-effective. Third, the invention allows the IC chip to be considerably reduced in size due to the elimination of test pads on the IC chip in the prior art which are instead formed in the scribe lines 14 between the various IC chips on the wafer.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for burn-in operation on a semiconductor wafer formed with a plurality of dice on each of which a memory device is formed and which are separated by a plurality of scribe lines, and each of said dice being formed with a built-in test circuit and a plurality of addresses and associated word lines, said method comprising the steps of:

forming at least a first pad and a second pad in one of said scribe lines;

connecting the first pad to the test circuit in each die;

connecting the second pad to the bias input end of each die;

generating and transferring an externally generated DC bias voltage via the second pad to the bias input end of each of the dice;

generating and transferring an externally generated burn-in enable signal via the first pad to the test circuit in each of the dice, said burn-in enable signal causing said test circuit to generate a burn-in oscillating signal;

converting the burn-in oscillating signal into a plurality of pulse trains which are used for burn-in operation on the periphery circuitry of the memory device other than the memory cells; and transferring the burn-in enable signal to a column sense amplifier and a row decoder, which enables the column sense amplifier and disables the row decoder, and further enables all the word lines and all the row addresses and disables all the column addresses, so as to perform burn-in on the memory cells of the memory device.

2. The method of claim 1, wherein said test circuit comprises:

a ring oscillator for generating the burn-in oscillating signal in response to the burn-in enable signal.

3. The method of claim 1, wherein a series of cascaded toggle circuits are used to generate the plurality of pulse trains used to perform burn-in on the periphery circuitry of the memory device other than the memory cells.

4. The method of claim 3, wherein the output periodic pulse train from one toggle circuit is twice in period to the output periodic pulse train from the previous one.

5. The method of claim 1, wherein during the burn-in operation, the internal bias of the memory cells is raised to equal the level of the externally generated DC bias voltage.

* * * * *